United States Patent
Bruner et al.

(10) Patent No.: US 11,099,212 B2
(45) Date of Patent: Aug. 24, 2021

(54) METHOD FOR CLEANING AND COATING A TIP OF A TEST PROBE UTILIZED IN A TEST SYSTEM FOR AN INTEGRATED CIRCUIT PACKAGE

(71) Applicant: ACULON, INC., San Diego, CA (US)

(72) Inventors: Eric L Bruner, La Jolla, CA (US); Eric L. Hanson, Carlsbad, CA (US)

(73) Assignee: ACULON INC., San Diego, CA (US)

( * ) Notice: Subject to any disclaimer, the term of this patent is extended or adjusted under 35 U.S.C. 154(b) by 0 days.

(21) Appl. No.: 16/827,154

(22) Filed: Mar. 23, 2020

(65) Prior Publication Data

US 2020/0256892 A1   Aug. 13, 2020

Related U.S. Application Data

(63) Continuation-in-part of application No. PCT/US2019/021752, filed on Mar. 12, 2019, and a continuation-in-part of application No. 15/919,078, filed on Mar. 12, 2018, now Pat. No. 10,627,426.

(51) Int. Cl.
| | |
|---|---|
| *G01R 3/00* | (2006.01) |
| *G01R 1/067* | (2006.01) |
| *B05D 1/28* | (2006.01) |
| *B08B 3/08* | (2006.01) |
| *B08B 1/00* | (2006.01) |
| *G01R 31/28* | (2006.01) |

(52) U.S. Cl.
CPC ............. *G01R 3/00* (2013.01); *B05D 1/28* (2013.01); *B08B 1/002* (2013.01); *B08B 3/08* (2013.01); *G01R 1/06722* (2013.01); *G01R 31/2896* (2013.01)

(58) Field of Classification Search
CPC ........ G01R 3/00; B08B 3/08; B05D 2202/00; C11D 7/36; C11D 7/5027; C11D 7/06
See application file for complete search history.

(56) References Cited

U.S. PATENT DOCUMENTS

| | | | |
|---|---|---|---|
| 6,474,350 B1 * | 11/2002 | Mizuta | C11D 7/08 134/56 R |
| 6,617,165 B1 | 9/2003 | Opitz | |
| 7,396,594 B2 | 7/2008 | Schwartz et al. | |
| 7,712,177 B2 | 5/2010 | Yoshida | |
| 8,025,974 B2 | 9/2011 | Hanson et al. | |
| 8,236,426 B2 | 8/2012 | Hanson et al. | |
| 8,445,423 B2 | 5/2013 | Bruner et al. | |
| 8,945,312 B2 | 2/2015 | Srutkowski | |
| 9,823,273 B2 | 11/2017 | Martin | |
| 2002/0190737 A1 | 12/2002 | Maekawa | |
| 2003/0138644 A1 * | 7/2003 | Khandros | B08B 1/00 428/447 |

(Continued)

*Primary Examiner* — Dominic E Hawkins
(74) *Attorney, Agent, or Firm* — Blynn L. Shideler; Krisanne Shideler; BLK Law Group

(57) ABSTRACT

A method for cleaning and coating a tip of a test probe in an integrated circuit package test system is provided. The method includes 1) saturating a brush tip comprising non-porous bristles with a solution of phosphonic acid; 2) applying the solution of phosphonic acid to the tip of the test probe with the brush tip to coat the tip of the test probe with the solution of phosphonic acid; and 3) allowing the solution of phosphonic acid to dry on the tip of the test probe and form a self-assembled monolayer of phosphonates thereon.

9 Claims, 1 Drawing Sheet

(56) References Cited

U.S. PATENT DOCUMENTS

| | | |
|---|---|---|
| 2006/0194008 A1 | 8/2006 | Schwartz |
| 2008/0184505 A1* | 8/2008 | Feroli .................... G01R 3/00 15/21.1 |
| 2012/0275026 A1 | 11/2012 | Zhou |
| 2014/0338698 A1 | 11/2014 | Humphrey |
| 2016/0356761 A1* | 12/2016 | Abdolahad ........... C23C 28/321 |
| 2017/0176495 A1 | 6/2017 | Yin |
| 2018/0265824 A1* | 9/2018 | Song ................. C11D 17/0039 |

\* cited by examiner

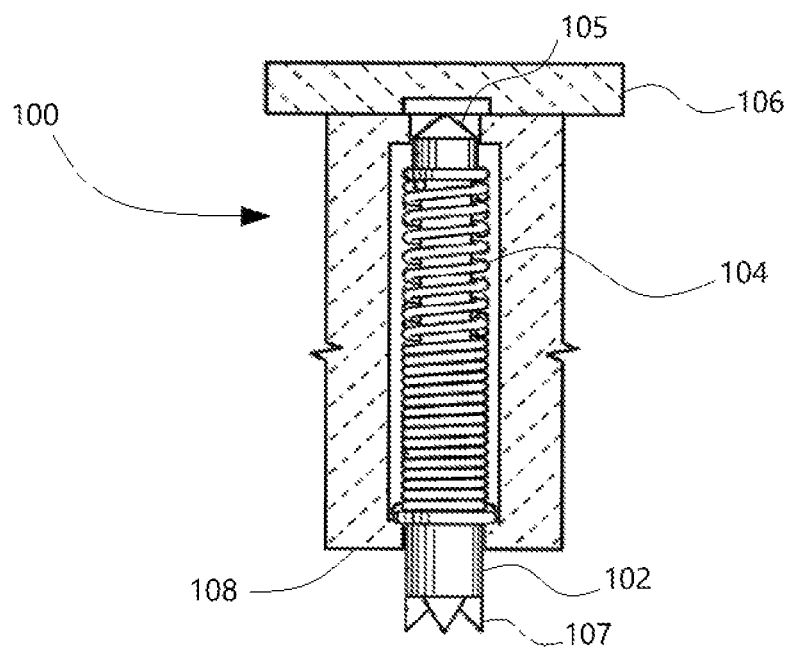

METHOD FOR CLEANING AND COATING A TIP OF A TEST PROBE UTILIZED IN A TEST SYSTEM FOR AN INTEGRATED CIRCUIT PACKAGE

CROSS-REFERENCE TO RELATED APPLICATIONS

This patent application is a Continuation-in-Part of U.S. patent application Ser. No. 15/919,078, filed Mar. 12, 2018, entitled: "METHOD AND KIT FOR CLEANING AND COATING A TIP OF A TEST PROBE UTILIZED IN A TEST SYSTEM FOR AN INTEGRATED CIRCUIT PACKAGE". This application is also a continuation-in-part of PCT International patent application number PCT/US2019/021752, filed Mar. 12, 2019, entitled: "METHOD AND KIT FOR CLEANING AND COATING A TIP OF A TEST PROBE UTILIZED IN A TEST SYSTEM FOR AN INTEGRATED CIRCUIT PACKAGE". Both of the aforementioned patent applications are incorporated herein by reference in their entireties.

FIELD OF THE INVENTION

The present invention relates to methods for cleaning and coating a tip of a test probe utilized in a test system for an integrated circuit package.

BACKGROUND OF THE INVENTION

In the manufacture of a microelectronic device, circuit packages are formed having an array of pins, pads, or lands that make contact with the rest of the device, typically through a printed circuit board. After production, each package must be tested to ensure that it has been manufactured correctly and all electrical contacts operate effectively.

To perform the tests, the packages may have lands, pads, or solder balls specifically included in the package for test purposes ("test contacts"). There is also an array of contacts that are used for normal operations, often in the form of solder balls.

In an integrated circuit test system, the test probes often comprise spring and sleeve connectors in which one or both ends of a cylindrical probe are spring-loaded to apply pressure against the test contacts of the package. One common type of spring-loaded test probe is referred to as a pogo pin. The test probes are mounted adjacent to a circuit board or attached to a substrate in a socket that aligns each probe in the proper position with respect to each respective contact so that when the package is pressed against the socket, each probe will effectively contact its respective contact such as a land, ball or pad. The probes also have a shaped tip so that when the probes are pressed against the package, the spring pressure will cause the tip to break through any oxide that has formed on the surface of the associated contact to ensure a good electrical connection. Signals are sent or received through the probes to test the device.

The tip of a test probe wears with each contact against the associated contact such as a solder ball test contact; the tip may also collect contaminants from the package connection. As a result, each test probe has a limited number of contacts and therefore a limited number of package tests that it can perform, after which the test probe is ineffective and must be replaced. With thousands of test probes in each socket, test probe replacement is a factor in the cost of device manufacturing. The pogo pin is used for many different testing functions, including burn in, class test, and system test. Because there are thousands of pins per socket, the pins represent a significant part of the cost of unit interface tooling (UIT).

As the test probe is repeatedly used, there are several different mechanisms that wear and contaminate the tip of the probe, rendering it unreliable. Typical plunger or cylinder materials include Pd alloy, steel, or Cu/Be alloy. In some cases, Au/Ni layers are coated over the tip to provide oxidation protection and improve electrical conduction. With repeated cycling, the plunger can degrade and become dulled, leading to an ineffective contact between the test probe tip and the tested unit. There may be an increase in the contact resistance (Cres) at the tip of the test probe. An initially sharp shape becomes dulled and no longer penetrates the solder ball. In addition, any coating layers on the probe tip may be worn off.

Each time the probe tip contacts a new package contact, it may also pick up contaminants. Sn, PbO and SnO are among the most common contaminants that a probe tip can pick up from a solder ball. Also, with the increasing use of No-Clean Paste (NCP) for Ball Grid Array (BGA) packages, a substantial amount of organic residue such as rosin remains on the solder ball and can be transferred to the probe tip. This can cause a socket open failure. The contaminants can be controlled by cleaning; however, regular cleaning is very expensive and time consuming, it takes the tool out of service and further wears on the tip. Mechanical rubbing, for example, can accelerate pogo-pin wearing, and speed up pin degradation failures.

It would be desirable to provide a convenient and cost effective method for cleaning and coating a tip of a test probe in an integrated circuit package test system that removes contaminants and provides protection to the test probe, allowing for extended use.

SUMMARY OF THE INVENTION

A method of cleaning and coating a tip of a test probe in a test system for an integrated circuit package is provided. The method comprises: 1) saturating a brush tip comprising nonporous bristles with a solution of phosphonic acid; 2) applying the solution of phosphonic acid to the tip of the test probe with the brush tip to coat the tip of the test probe with the solution of phosphonic acid; and 3) allowing the solution of phosphonic acid to dry on the tip of the test probe and form a self-assembled monolayer of phosphonates thereon.

BRIEF DESCRIPTION OF THE DRAWING

FIG. 1 (FIG. 1) is a cross-sectional side view of an exemplary spring-loaded test probe in a socket body with a pusher plate comprising a tip that is coated with a self-assembled monolayer of phosphonates according to one embodiment of the present invention.

DETAILED DESCRIPTION OF THE INVENTION

Other than in any operating examples, or where otherwise indicated, all numbers expressing quantities of ingredients, reaction conditions and so forth used in the specification and claims are to be understood as being modified in all instances by the term "about." Accordingly, unless indicated to the contrary, the numerical parameters set forth in the following specification and attached claims are approximations that may vary depending upon the desired properties to be obtained by the present invention. At the very least, and not as an attempt to limit the application of the doctrine of equivalents to the scope of the claims, each numerical parameter should at least be construed in light of the number of reported significant digits and by applying ordinary rounding techniques.

Notwithstanding that the numerical ranges and parameters setting forth the broad scope of the invention are approximations, the numerical values set forth in the specific examples are reported as precisely as possible. Any numerical value, however, inherently contain certain errors necessarily resulting from the standard deviation found in their respective testing measurements.

Also, it should be understood that any numerical range recited herein is intended to include all sub-ranges subsumed therein. For example, a range of "1 to 10" is intended to include all sub-ranges between (and including) the recited minimum value of 1 and the recited maximum value of 10, that is, having a minimum value equal to or greater than 1 and a maximum value of equal to or less than 10.

As used in this specification and the appended claims, the articles "a," "an," and "the" include plural referents unless expressly and unequivocally limited to one referent.

The various aspects and examples of the present invention as presented herein are each understood to be non-limiting with respect to the scope of the invention.

The present invention provides a method for cleaning a tip 107 of a test probe 100 utilized in a test system for an integrated circuit package, and coating the tip with a self-assembled monolayer of phosphonates. A cross-sectional side view of an exemplary spring-loaded test probe 100 in a socket body 108 with a pusher plate 106 is illustrated in FIG. 1. The present invention can be implemented with many test probes and the details of the test probe 100 as illustrated, other than the coating and cleaning thereof, are shown in U.S. Patent Publication 2017-0176495, which is incorporated herein by reference in its entirety.

An integrated circuit test probe 100, which may be one of several hundred or even thousands in an integrated circuit package, comprises a main plunger body or cylinder 102 that is partially inside a sleeve. The cylinder 102 is longer than the sleeve and reciprocates within the sleeve. A spring 104 is attached to the cylinder 102 and the sleeve to drive the cylinder in a particular direction. The cylinder 102 has an end 105 for contacting the pusher plate 106 and a tip 107 for engaging a contact such as a solder ball of a ball grid array or any other type of connection array of an integrated circuit package. The tip 107 of the plunger body 102 can be made of any of a number of electrically conductive materials, and manufactured into different shapes, such as a crown shape as shown in FIG. 1 to provide stable contact with the solder ball type contacts. The sleeve of the test probe 100 is mounted to a socket 108 and fixed in place within the socket 108. In this example, the test probe may include a housing wherein sleeve threads are screwed into the housing to hold the sleeve, and the housing is attached to the socket 108 using an adhesive or another suitable attachment technique. The pusher plate 106 is pressed against the end 105 to drive the cylinder 102 toward a test contact or an electrical contact in a package. In FIG. 1, the probe 100 is shown in the engaged position; when the pusher plate 106 is released, the spring 104 relaxes and the cylinder 102 moves upward in the socket 108.

The method of the present invention comprises: 1) saturating a brush tip comprising nonporous bristles with a solution of phosphonic acid; 2) applying the solution of phosphonic acid to the tip of the test probe with the brush tip to coat the tip of the test probe with the solution of phosphonic acid; and 3) allowing the solution of phosphonic acid to dry on the tip of the test probe and form a self-assembled monolayer of phosphonates thereon.

In the first step of the method, a brush tip comprising nonporous bristles, or filaments, is saturated with a solution of phosphonic acid. The brush may further comprise a handle allowing for ease of use and application by hand of the solution of phosphonic acid onto the tip of the test probe. The bristles are typically made of a metal or a synthetic, nonporous material. The bristle material is compatible with solvents/diluents that are frequently used to prepare the phosphonic acid solution, in order to allow for sufficient wetting of the bristles and to prevent degradation of the bristles or contamination of the solution due to dissolving or reaction of the bristle material. Suitable metals include stainless steel and any other metals that will not react with phosphonic acid. Exemplary nonporous synthetic materials include polyester, nylon or a blend of nylon and polyester. The bristles most often comprise metal or nylon. The nonporous filaments can be hollow or solid and can be tapered or untapered. The tuft of filaments (i. e., brush tip) may be flat or round, with the filaments arranged in any shape that allows for even application of the solution onto the tip of the test probe. Common tuft shapes include pointed, flat, domed, fan, angled, rigger, and dagger. A flat tuft shape typically allows for the most effective application of the solution onto the tip of the test probe. The bristles usually range in length from at least 1 mm, such as at least 2 mm, or at least 3 mm, to at most 15 mm or at most 10 mm, or at most 7 mm. The width of the tuft is usually from at least 1 mm, such as at least 2 mm, or at least 5 mm, to at most 20 mm or at most 15 mm, or at most 10 mm.

The tuft of the brush may be saturated with a solution of a phosphonic acid by immersing the tuft into a vessel containing the phosphonic acid solution. The vessel may, for example, comprise a small vial of up to a 10 ml volume, such as a 2-5 ml volume, for inclusion in a convenient application kit. Suitable examples of phosphonic acids include organophosphonic acids such as amino trismethylene phosphonic acid, aminobenzylphosphonic acid, 3-amino propyl phosphonic acid, O-aminophenyl phosphonic acid, 4-methoxyphenyl phosphonic acid, aminophenylphosphonic acid, aminophosphonobutyric acid, aminopropylphosphonic acid, benzhydrylphosphonic acid, benzylphosphonic acid, butylphosphonic acid, carboxyethylphosphonic acid, diphenylphosphinic acid, dodecylphosphonic acid, ethylidenediphosphonic acid, heptadecylphosphonic acid, methylbenzylphosphonic acid, naphthylmethylphosphonic acid, octadecylphosphonic acid, octylphosphonic acid, pentylphosphonic acid, phenylphosphinic acid, phenylphosphonic acid, bis-(perfluoroheptyl)phosphinic acid, perfluorohexyl phosphonic acid, styrene phosphonic acid, and/or dodecyl bis-1,12-phosphonic acid. Note that the phrase "and/or" when used in a list is meant to encompass alternative embodiments including each individual component in the list as well as any combination of components. For example, the list "A, B, and/or C" is meant to encompass seven separate embodiments that include A, or B, or C, or A+B, or A+C, or B+C, or A+B+C. In addition to the monomeric phosphonic acids, oligomeric or polymeric acids resulting from self-condensation of the respective monomeric acids may be used.

The phosphonic acid is typically dissolved or dispersed in a diluent. Suitable diluents include alcohols having 1 to 4 carbon atoms such as such as methanol, ethanol, n-propanol, isopropanol, n-butanol, and/or isobutanol; aliphatic hydrocarbons such as hexane, isooctane and decane; ethers, for example, tetrahydrofuran; and dialkylethers such as diethylether. Perfluorinated compounds such as perfluorinated tetrahydrofuran are also suitable. Also, aqueous alkaline solutions of sodium and/or potassium hydroxide can be used as the diluent.

Adjuvant materials may be present with the phosphonic acid and the diluent (organic acid compositions). Examples include surface active agents, stabilizers, wetting agents and anti-static agents known in the art. When used, the adjuvants are present in amounts of up to 30 percent by weight based on the non-volatile content of the organic acid composition.

The concentration of the phosphonic acid in the solution is not particularly critical but is at least 0.01 millimolar, typically 0.01 to 100 millimolar, and more typically 0.1 to 50 millimolar. The phosphonic acid composition can be prepared by mixing all of the components at the same time or by adding the components in several steps.

In the second step of the method of the present invention, the solution of phosphonic acid is applied to the tip of the test probe with the brush tip to coat the tip of the test probe with the solution of phosphonic acid. In the third step, the solution of phosphonic acid is allowed to dry on the tip 107 of the test probe and form a self-assembled monolayer of phosphonates thereon. Drying typically occurs at ambient conditions; by "ambient conditions" is meant the condition of surroundings without adjustment of the temperature, humidity or pressure. Usually ambient temperature ranges from 60 to 90° F. (15.6 to 32.2° C.), such as a typical room temperature, 72° F. (22.2° C.). Heat may be applied to facilitate drying.

The self-assembled monolayer of phosphonates typically demonstrates a thickness less than 5 nanometers, such as less than 3 nanometers. The layer demonstrates a very uniform thickness over the surface of the probe tip and serves as a conformal coating. By "unifom" is meant that the thickness of the layer over the surface of the tip of the test probe typically varies by no more than 50 percent.

Whereas particular embodiments of this invention have been described above for purposes of illustration, it will be evident to those skilled in the art that numerous variations of the details of the present invention may be made without departing from the scope of the invention as defined in the appended claims.

What is claimed is:

1. A method of cleaning and coating a tip of a test probe in a test system for an integrated circuit package, said method comprising 1) saturating a brush tip comprising metal bristles with a solution of phosphonic acid; 2) applying the solution of phosphonic acid to the tip of the test probe with the brush tip to coat the tip of the test probe with the solution of phosphonic acid; and 3) allowing the solution of phosphonic acid to dry on the tip of the test probe and form a self-assembled monolayer of phosphonates thereon; wherein the phosphonic acid is dissolved or dispersed in an alcohol having 1 to 4 carbon atoms, hexane, isooctane, decane, an ether, a dialkylether, a perfluorinated compound, or an aqueous alkaline solution of sodium and/or potassium hydroxide.

2. The method of claim 1, wherein the test probe comprises a pogo-pin that is spring-loaded within a socket.

3. The method of claim 1, wherein the metal bristles comprise stainless steel.

4. The method of claim 1, wherein the phosphonic acid is dissolved or dispersed in methanol, ethanol, n-propanol, isopropanol, n-butanol, isobutanol, hexane, isooctane, decane, tetrahydrofuran, diethylether, perfluorinated tetrahydrofuran, or an aqueous alkaline solution of sodium and/or potassium hydroxide.

5. The method of claim 1, wherein the solution of phosphonic acid is allowed to dry on the tip of the test probe under ambient conditions.

6. The method of claim 1, wherein a self-assembled monolayer of phosphonates less than 5 nanometers thick is formed on the tip of the test probe.

7. A method of cleaning and coating a tip of a test probe in a test system for an integrated circuit package, said method comprising 1) saturating a brush tip comprising metal bristles with a solution of phosphonic acid; 2) applying the solution of phosphonic acid to the tip of the test probe with the brush tip to coat the tip of the test probe with the solution of phosphonic acid; and 3) allowing the solution of phosphonic acid to dry on the tip of the test probe under ambient conditions and form a self-assembled monolayer of phosphonates thereon, wherein the phosphonic acid is dissolved or dispersed in an alcohol having 1 to 4 carbon atoms, hexane, isooctane, decane, an ether, a dialkylether, a perfluorinated compound, or an aqueous alkaline solution of sodium and/or potassium hydroxide, and wherein the self-assembled monolayer of phosphonates is less than 5 nanometers thick.

8. The method of claim 7, wherein the test probe comprises a pogo-pin that is spring-loaded within a socket.

9. The method of claim 7, wherein the phosphonic acid is dissolved or dispersed in methanol, ethanol, n-propanol, isopropanol, n-butanol, isobutanol, hexane, isooctane, decane, tetrahydrofuran, diethylether, perfluorinated tetrahydrofuran, or an aqueous alkaline solution of sodium and/or potassium hydroxide.

* * * * *